United States Patent
Chen

(10) Patent No.: US 6,647,868 B2
(45) Date of Patent: Nov. 18, 2003

(54) POSITION ADJUSTMENT IN LASER-ASSISTED PRESSING

(75) Inventor: Ching-Chuan Chen, Taipei (TW)

(73) Assignee: Hannstar Display Corp., Taipei (TW)

( * ) Notice: Subject to any disclaimer, the term of this patent is extended or adjusted under 35 U.S.C. 154(b) by 47 days.

(21) Appl. No.: 09/907,040

(22) Filed: Jul. 17, 2001

(65) Prior Publication Data

US 2002/0059871 A1 May 23, 2002

(30) Foreign Application Priority Data

Nov. 22, 2000 (TW) ........................................ 89124739 A

(51) Int. Cl.⁷ ................................................ B30B 5/02
(52) U.S. Cl. ......................... 100/99; 100/102; 100/211
(58) Field of Search ........................ 100/35, 99, 229 R, 100/226, 43, 102, 211; D15/128; 29/34 R; 83/249, 468, 468.2, 30, 743, 744, 745, 445, 211, 240, 279, 391, 906, 929.1

(56) References Cited

U.S. PATENT DOCUMENTS

| | | | | |
|---|---|---|---|---|
| 2,806,492 A | * | 9/1957 | Becker | ........................ 83/520 |
| 4,102,568 A | * | 7/1978 | Miyagi | ........................ 353/28 |
| 5,285,708 A | * | 2/1994 | Bosten et al. | .................. 83/520 |
| 5,299,515 A | * | 4/1994 | Baba et al. | .................. 112/130 |
| 5,663,885 A | * | 9/1997 | Stahl | ........................ 700/131 |

* cited by examiner

Primary Examiner—Mickey Yu
Assistant Examiner—Gregory Pickett
(74) Attorney, Agent, or Firm—Thomas, Kayden, Horstemeyer & Risley

(57) ABSTRACT

A method of laser-assisted pressing is used to adjust the pressing position with a laser projector and an impressible element while pressing an opaque object. The apparatus in this invention is characterized by a platform, a pressing unit with at least one press head, and at least one laser projector for projecting a laser beam to form a light area. The press head presses the impressible element to form a pressure mark indicating the pressing position. The light area is then adjusted to match the pressure mark. Finally, the relative positioning of the platform and the pressing unit is adjusted to match the light area with the area to be pressed. Thus the pressing position will be accurate in the pressing process.

4 Claims, 3 Drawing Sheets

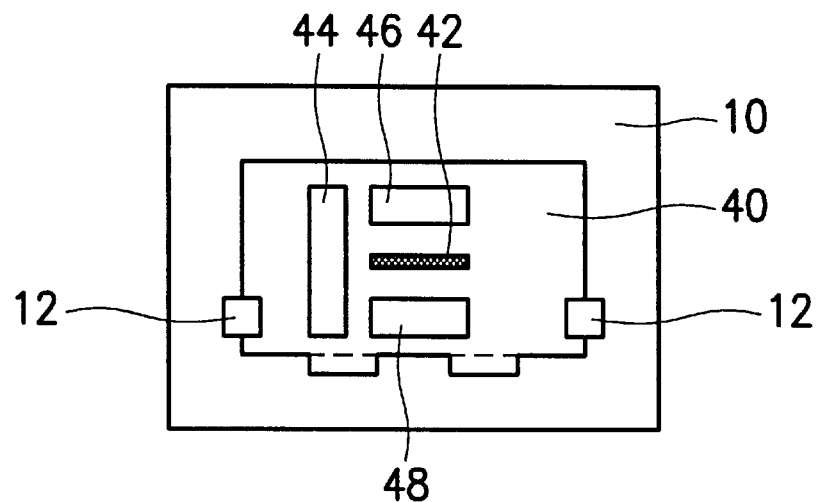
FIG. 1a
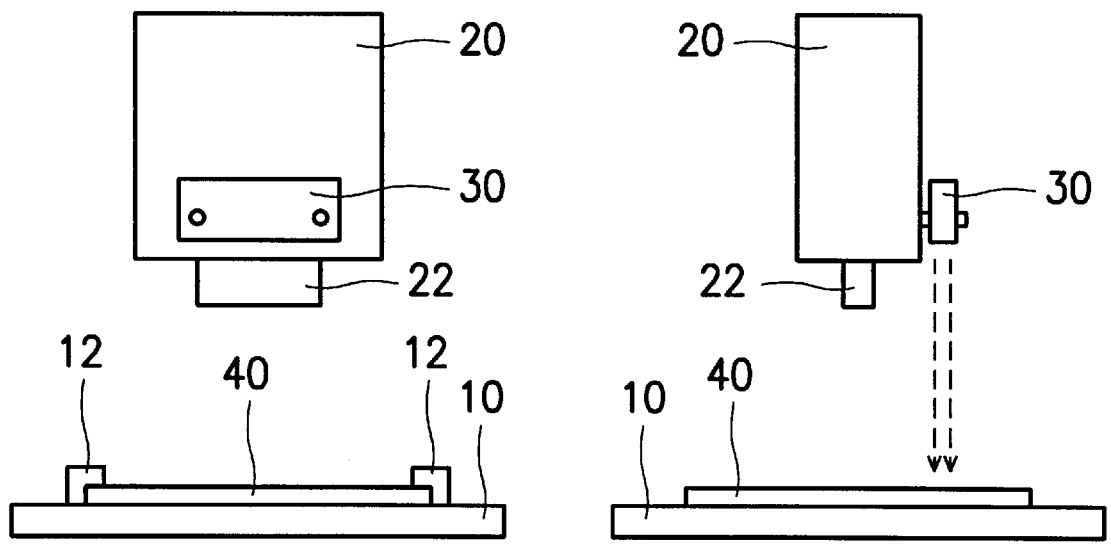
FIG. 1b
FIG. 1c

POSITION ADJUSTMENT IN LASER-ASSISTED PRESSING

BACKGROUND OF THE INVENTION

1. Field of the Invention

The present invention relates to position adjustment in laser-assisted pressing, and more particularly to a pressing position adjustment method for rapidly and accurately adjusting the pressing position with a laser projector and an impressible element while pressing an opaque object.

2. Description of the Related Art

Traditionally, pressing position adjustment is a necessary step in the pressing process. In a pressing process with a press machine, for example, the press machine comprises a press unit having a press head, and a platform to support the object to be pressed. In this case, the relative adjustment of the press head's position and the object area to be pressed on the platform is a necessary step. If the pressing is not accurately positioned, the object may be damaged or incompletely pressed. Consequently, it is important to ensure an accurate pressing position.

In a traditional method of pressing position adjustment, a manual adjustment process is commonly performed on a desired object to be pressed. First, the object, such as a printed circuit board, is disposed on the platform, with the area to be pressed roughly matching the position of the press head. The press machine is then engaged so the press head is deployed onto the circuit board, and deviation between the pressing position and the area to be pressed can be visually observed. The press head is raised, and the platform position is adjusted. If any deviation still exists, the press head is repeatedly deployed and raised, until the pressing position is correct.

The traditional pressing position adjustment method, however, has obvious drawbacks. In the above-mentioned press machine, the press head is generally inside the press machine (such as a soldering machine), and the space between the press head and the object is limited, thus creating difficulty in observing any deviation in the pressing position. In addition, the repeated deployment and raising in the adjustment process requires increased time. Further, because objects such as printed circuit boards are repeatedly adjusted during the pressing position adjustment, the press head may contact elements on the circuit board outside of the area to be pressed, or the board may be pressed beyond its pressure endurance. Both of them may result in damage to the board.

SUMMARY OF THE INVENTION

Therefore, the object of this invention is to provide a pressing position method that avoids the drawbacks in the method of the prior art.

The present invention discloses an apparatus and a pressing position adjustment method of laser-assisted pressing. In the apparatus of this invention, a laser projector for projecting a light area is provided on a pressing unit that has at least one press head. While adjusting the pressing position, an impressible element such as a piece of impressible paper is used instead of directly using the object to be pressed.

The special property of the above-mentioned element is that a pressure mark registers thereon. As a result, the pressure mark acts as an indicator of the position of the press head, and the light area projected by the laser projector can be a further indication of the pressing position when the light area matches the pressure mark. The impressible element can be removed, the object to be pressed can be placed on the platform, and the light area can be used to match the pressing position with the area to be pressed on the object.

The advantage of the present invention follows. First, in cases where the object to be pressed is made of opaque material, it is easier to observe the pressing position with the assistance of the laser light area, thus simplifying the adjustment procedure. In addition, the pressure mark on the impressible element can be created in one pressing step, thus eliminating the repeated deployment and raising of the press head. Further, the pressing motion in the traditional adjustment method is omitted; thus, any possibility of contacting elements outside of the area to be pressed is significantly reduced.

BRIEF DESCRIPTION OF THE DRAWINGS

The present invention can be more fully understood by reading the subsequent detailed description in conjunction with the examples and references made to the accompanying drawings, wherein:

FIG. 1a is a top view of the platform with a printed circuit board provided thereon in an embodiment of the present invention;

FIG. 1b is a front view of the pressing apparatus of the embodiment;

FIG. 1c is a side view of the pressing apparatus of the embodiment;

DETAILED DESCRIPTION OF THE PREFERRED EMBODIMENT

Figure 2A:
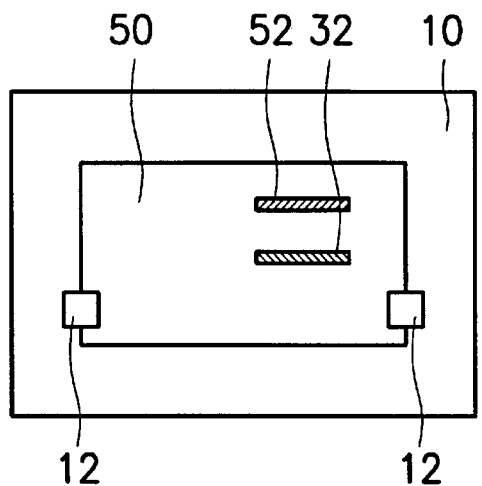
FIGS. 2a and 2b are schematic views of the embodiment showing the adjustment process of the light area to the pressure mark.

An embodiment of the pressing apparatus of the present invention is shown in FIGS. 1a to 1c. The apparatus in this embodiment comprises a platform 10, a pressing unit 20, and a laser projector 30. As shown in FIG. 1a, a plurality of clamps 12 is provided on the platform 10. The clamps 12 are used to fix the object to be pressed, such as a printed circuit board 40, placed on the platform 10. An area to be pressed 42 and a plurality of circuit element areas 44, 46, and 48 near the area 42 are provided on the circuit board 40. The pressing unit 20 as shown in FIGS. 1b and 1c has at least one press head 22 for pressing the area to be pressed 42 on the circuit board 40 without pressing areas 44, 46, and 48. Further, the laser projector 30 for projecting a laser beam is provided in the pressing unit 20.

The size and shape of the press head 22 is determined by the size and shape of the area 42. In this embodiment, the shape of the press head 22 is line-shaped with its width much shorter than its length. Thus the laser projector 30 can be a laser liner for producing a line-shaped light area similar in shape and size to the area 42.

The laser-assisted pressing position adjustment method according to this embodiment can be described with reference to FIGS. 2a to 2d. First, an impressible element such as a piece of impressible paper 50 is provided on the platform 10, and the press head 22 presses down on the element 50 to form a pressure mark 52. The object of the pressure mark 52 is to indicate the pressing position of the press head 22. That is, the pressing position on the object to be pressed will be in the same position as the pressure mark, when there is no relative displacement of the pressing unit 20 and the platform 10.

Figure 2B:
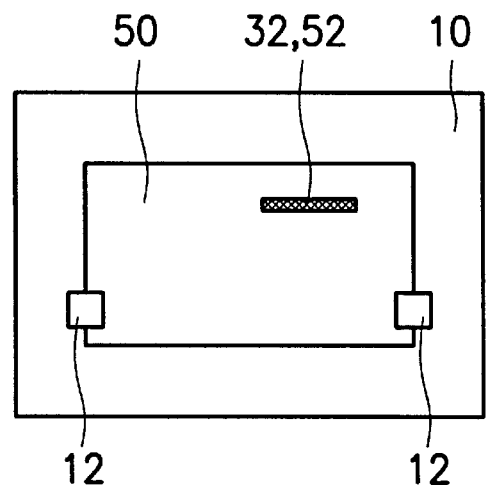

Then, the laser projector 30 is turned on to project a light beam on the paper 50 forming a light area 32. As shown in FIG. 2a, the light area 32 does not necessarily match the pressure mark 52. Therefore, it is necessary to adjust the laser projector 30 so that the light area 32 matches the pressure mark 52 as shown in FIG. 2b; that is, the light area 32 corresponds to the pressing position.

Figure 2C:
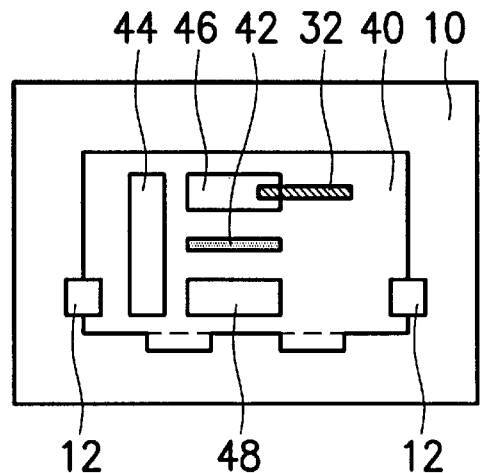
FIGS. 2c and 2d are schematic views of the embodiment showing the adjustment process of the relative position of the pressing unit and the platform.
Figure 2D:
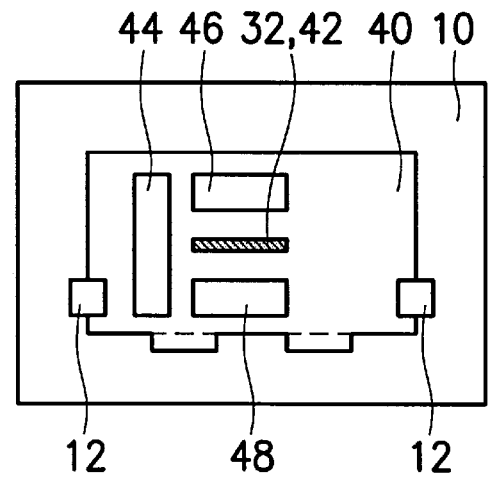

After the step of adjusting the laser projector as mentioned above, the object to be pressed, such as the circuit board 40, is placed on the platform 10 for pressing. While placing the circuit board 40, the area to be pressed 42 roughly matches with the pressing position, so that it is possible that the pressing position indicated by the light area 32 corresponds with the circuit element area 46 as shown in FIG. 2c. In this case, the relative position of the platform 10 and the pressing unit 20 are adjusted so that the light area 32 matches the area 42, as shown in FIG. 2d; then the pressing is carried out.

In the above-mentioned process, the press head 22 does not press on the circuit board 40 during adjustment. That is, the pressing position adjustment process is carried out with the assistance of the light area 32 projected by the laser projector 30. Thus, the drawbacks in the traditional adjustment process are eliminated.

Figure 3:
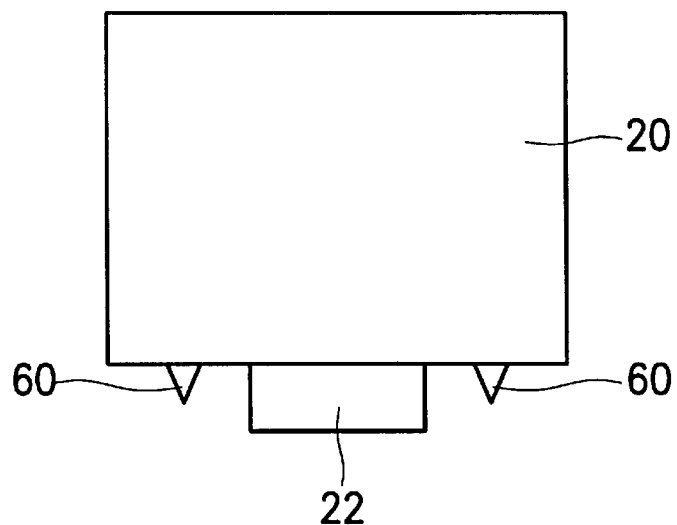
FIG. 3 is a schematic view of another embodiment of the present invention showing the laser projector.
Figure 4A:
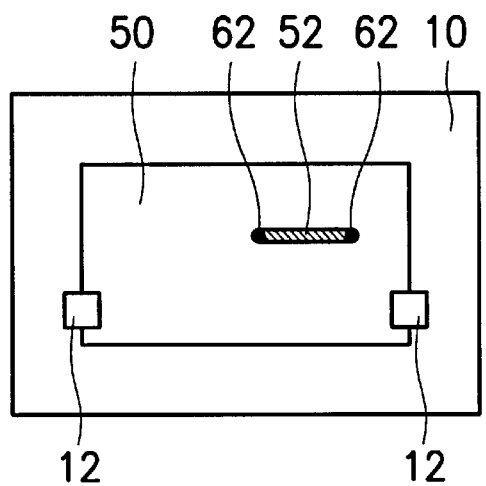
FIG. 4a is a schematic view of another embodiment of the present invention showing the pressure mark indicated with the line-shaped light area.
Figure 4B:
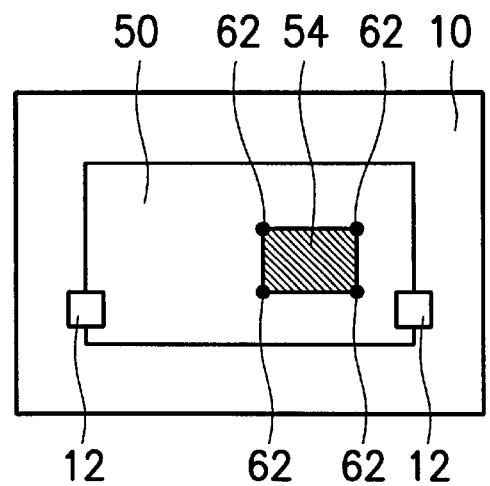
FIG. 4b is a schematic view of another embodiment of the present invention showing the pressure mark indicated with the point light area.

It is noted that a laser liner is used as the laser projector 30 in this embodiment, and the light area projected thereby is a line-shaped area. However, any other types and numbers of laser projectors are acceptable in the present invention, such as the plurality of laser pointers 60 shown in FIG. 3, referred to as another embodiment of this invention. A laser pointer 60 projects a dotted-shaped light area on the paper; as a result, while using laser pointers as the laser projector, it is necessary to provide at least two laser pointers 60 in the pressing unit 20. In another embodiment of this invention as shown in FIG. 4a, the pressure mark 52 is a line-shaped area, and it requires two dotted-shaped light areas 62 indicating positions of the two ends of the pressure mark 52. Further, in still another embodiment of this invention as shown in FIG. 4b, because the size and shape of the press head 22 are changed, the pressure mark is a different area-shaped mark 54, which can be indicated by several dotted shaped light areas 62 on the boundary of the mark 54.

While the present invention has been described with reference to the preferred embodiments thereof, it is to be understood that the invention is not limited to the described embodiments or constructions. On the contrary, the invention is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A laser-assisted pressing apparatus for pressing an object to be pressed, the pressing apparatus comprising:

an impressible element for registering a pressure mark to perform adjustment of the pressing position to match the object's area to be pressed, wherein the impressible element is a piece of impressible paper;

a platform for supporting one of the impressible element or the object at a time;

a pressing unit having at least one press head to press the impressible element, registering a pressure mark and pressing the object after adjustment of the pressing position to match the object's area to be pressed; and a laser projector for projecting a laser beam onto the pressure mark to form a light area corresponding to the pressing position, the laser projector provided on the pressing unit.

2. The apparatus as claimed in claim 1, wherein the object to be pressed is an opaque printed circuit board.

3. The apparatus as claimed in claim 1, wherein the laser projector is a laser liner.

4. The apparatus as claimed in claim 1, wherein the laser projector comprises a plurality of laser pointers.

* * * * *